United States Patent
Eguchi et al.

(10) Patent No.: US 8,058,083 B2
(45) Date of Patent: Nov. 15, 2011

(54) METHOD FOR MANUFACTURING FLEXIBLE SEMICONDUCTOR DEVICE

(75) Inventors: Shingo Eguchi, Tochigi (JP); Yoshiaki Oikawa, Tochigi (JP); Masahiro Katayama, Tochigi (JP); Ami Nakamura, Tochigi (JP); Yohei Monma, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 31 days.

(21) Appl. No.: 12/619,776

(22) Filed: Nov. 17, 2009

(65) Prior Publication Data

US 2010/0124795 A1   May 20, 2010

(30) Foreign Application Priority Data

Nov. 20, 2008  (JP) ................. 2008-296369

(51) Int. Cl.
*H01L 21/00* (2006.01)
(52) U.S. Cl. ............. 438/29; 438/22; 438/30; 438/104; 438/106; 438/107; 257/E21.133
(58) Field of Classification Search .............. None
See application file for complete search history.

(56) References Cited

U.S. PATENT DOCUMENTS

| | | | |
|---|---|---|---|
| 5,308,967 A | 5/1994 | Jurisch | |
| 5,541,399 A | 7/1996 | Vall | |
| 5,757,456 A | 5/1998 | Yamazaki et al. | |
| 5,821,138 A | 10/1998 | Yamazaki et al. | |
| 5,854,123 A | 12/1998 | Sato et al. | |
| 5,891,298 A | 4/1999 | Kuroda et al. | |
| 6,100,166 A | 8/2000 | Sakaguchi et al. | |
| 6,127,199 A | 10/2000 | Inoue et al. | |
| 6,326,279 B1 | 12/2001 | Kakizaki et al. | |
| 6,372,608 B1 | 4/2002 | Shimoda et al. | |
| 6,391,220 B1 | 5/2002 | Zhang et al. | |
| 6,422,473 B1 | 7/2002 | Ikefuji et al. | |
| 6,452,091 B1 | 9/2002 | Nakagawa et al. | |
| 6,645,830 B2 | 11/2003 | Shimoda et al. | |
| 6,682,963 B2 | 1/2004 | Ishikawa | |
| 6,818,530 B2 | 11/2004 | Shimoda et al. | |
| 6,849,877 B2 | 2/2005 | Yamazaki et al. | |

(Continued)

FOREIGN PATENT DOCUMENTS

CN           1283874        2/2001
(Continued)

*Primary Examiner* — N. Drew Richards
*Assistant Examiner* — Kyoung Lee
(74) *Attorney, Agent, or Firm* — Eric J. Robinson; Robinson Intellectual Property Law Office, P.C.

(57) ABSTRACT

It is an object of one embodiment of the preset invention to conduct separation without damaging a semiconductor element when the semiconductor element is made flexible. Further, it is another object of one embodiment of the preset invention to provide a technique for weakening adhesion between a separation layer and a buffer layer. Furthermore, it is another object of one embodiment of the preset invention to provide a technique for preventing generation of the bending stress on a semiconductor element due to separation. A semiconductor element formed over a separation layer with a buffer layer interposed therebetween is separated by dissolving the separation layer by using an etchant. Alternatively, separation is conducted by inserting a film into a region where a separation layer is dissolved by being in contact with an etchant and moving the film in a direction toward a region where the separation layer is not dissolved.

18 Claims, 12 Drawing Sheets

U.S. PATENT DOCUMENTS

| | | |
|---|---|---|
| 6,911,358 B2 | 6/2005 | Azami et al. |
| 6,953,735 B2 | 10/2005 | Yamazaki et al. |
| 6,982,181 B2 | 1/2006 | Hideo |
| 7,029,950 B2 | 4/2006 | Yonehara et al. |
| 7,045,442 B2 | 5/2006 | Maruyama et al. |
| 7,060,153 B2 | 6/2006 | Yamazaki et al. |
| 7,060,591 B2 | 6/2006 | Yamazaki et al. |
| 7,067,392 B2 | 6/2006 | Yamazaki et al. |
| 7,091,070 B2 | 8/2006 | Imai et al. |
| 7,094,665 B2 | 8/2006 | Shimoda et al. |
| 7,105,448 B2 | 9/2006 | Takayama et al. |
| 7,147,740 B2 | 12/2006 | Takayama et al. |
| 7,159,241 B1 | 1/2007 | Horiguchi et al. |
| 7,271,076 B2 | 9/2007 | Yamazaki et al. |
| 7,285,476 B2 | 10/2007 | Shimoda et al. |
| 7,351,300 B2 | 4/2008 | Takayama et al. |
| 7,452,786 B2 | 11/2008 | Dozen et al. |
| 7,465,647 B2 | 12/2008 | Yamazaki et al. |
| 2001/0015256 A1 | 8/2001 | Yamazaki et al. |
| 2003/0006121 A1 | 1/2003 | Lee et al. |
| 2003/0022403 A1 | 1/2003 | Shimoda et al. |
| 2003/0032210 A1 | 2/2003 | Takayama et al. |
| 2004/0016115 A1 | 1/2004 | Hashimoto |
| 2004/0026520 A1 | 2/2004 | Kawai et al. |
| 2004/0118805 A1 | 6/2004 | Hareland et al. |
| 2004/0129960 A1 | 7/2004 | Maruyama et al. |
| 2004/0132265 A1 | 7/2004 | Maruyama et al. |
| 2005/0116048 A1 | 6/2005 | Sauter et al. |
| 2005/0148121 A1* | 7/2005 | Yamazaki et al. ............ 438/149 |
| 2005/0176180 A1 | 8/2005 | Fay et al. |
| 2005/0266591 A1 | 12/2005 | Hideo |
| 2005/0285231 A1 | 12/2005 | Arao et al. |
| 2005/0287846 A1 | 12/2005 | Dozen et al. |
| 2006/0011288 A1 | 1/2006 | Watanabe et al. |
| 2006/0063309 A1 | 3/2006 | Sugiyama et al. |
| 2006/0068536 A1* | 3/2006 | Yamazaki ..................... 438/197 |
| 2006/0121694 A1 | 6/2006 | Tamura |
| 2006/0131069 A1 | 6/2006 | Shimizu et al. |
| 2006/0189097 A1 | 8/2006 | Maruyama et al. |
| 2006/0216909 A1 | 9/2006 | Yamazaki et al. |
| 2007/0010067 A1 | 1/2007 | Shimoda et al. |
| 2007/0029554 A1* | 2/2007 | Nakamura et al. ............. 257/72 |
| 2007/0063057 A1 | 3/2007 | Masubuchi et al. |
| 2007/0161159 A1 | 7/2007 | Yamazaki et al. |
| 2007/0176234 A1 | 8/2007 | Yamazaki et al. |
| 2007/0181246 A1 | 8/2007 | Yamashita et al. |
| 2007/0194323 A1* | 8/2007 | Takano et al. ................... 257/72 |
| 2007/0196999 A1* | 8/2007 | Tamura et al. ................ 438/458 |
| 2007/0243352 A1 | 10/2007 | Takayama et al. |
| 2008/0042168 A1 | 2/2008 | Watanabe et al. |
| 2008/0044940 A1 | 2/2008 | Watanabe et al. |
| 2008/0113486 A1 | 5/2008 | Eguchi et al. |
| 2008/0132033 A1 | 6/2008 | Eguchi et al. |

FOREIGN PATENT DOCUMENTS

| | | |
|---|---|---|
| CN | 1458665 | 11/2003 |
| CN | 1618602 | 5/2005 |
| EP | 0 848 415 | 6/1998 |
| EP | 1 069 602 | 1/2001 |
| EP | 1 363 319 | 11/2003 |
| EP | 1 434 263 | 6/2004 |
| EP | 1 435 653 | 7/2004 |
| EP | 1 455 394 | 9/2004 |
| JP | 08-254686 | 10/1996 |
| JP | 10-125929 | 5/1998 |
| JP | 10-125931 | 5/1998 |
| JP | 2001-026500 | 1/2001 |
| JP | 2001-111081 | 4/2001 |
| JP | 2001-272923 | 10/2001 |
| JP | 2001-331120 | 11/2001 |
| JP | 2003-174153 | 6/2003 |
| JP | 2004-047975 | 2/2004 |
| JP | 2004-214281 | 7/2004 |
| JP | 2004-221561 | 8/2004 |
| JP | 2004-311955 | 11/2004 |
| JP | 2005-079395 | 3/2005 |
| JP | 2005-079553 | 3/2005 |
| JP | 2005-148638 | 6/2005 |
| JP | 2006-202820 | 8/2006 |
| KR | 1999-0028523 | 4/1999 |
| KR | 2005-0048517 | 5/2005 |
| WO | WO 97/08745 | 3/1997 |
| WO | WO 03/010825 | 2/2003 |
| WO | WO 2005/057658 | 6/2005 |
| WO | WO 2005/076358 | 8/2005 |
| WO | WO 2006/001287 | 1/2006 |
| WO | WO 2006/022169 | 3/2006 |

* cited by examiner

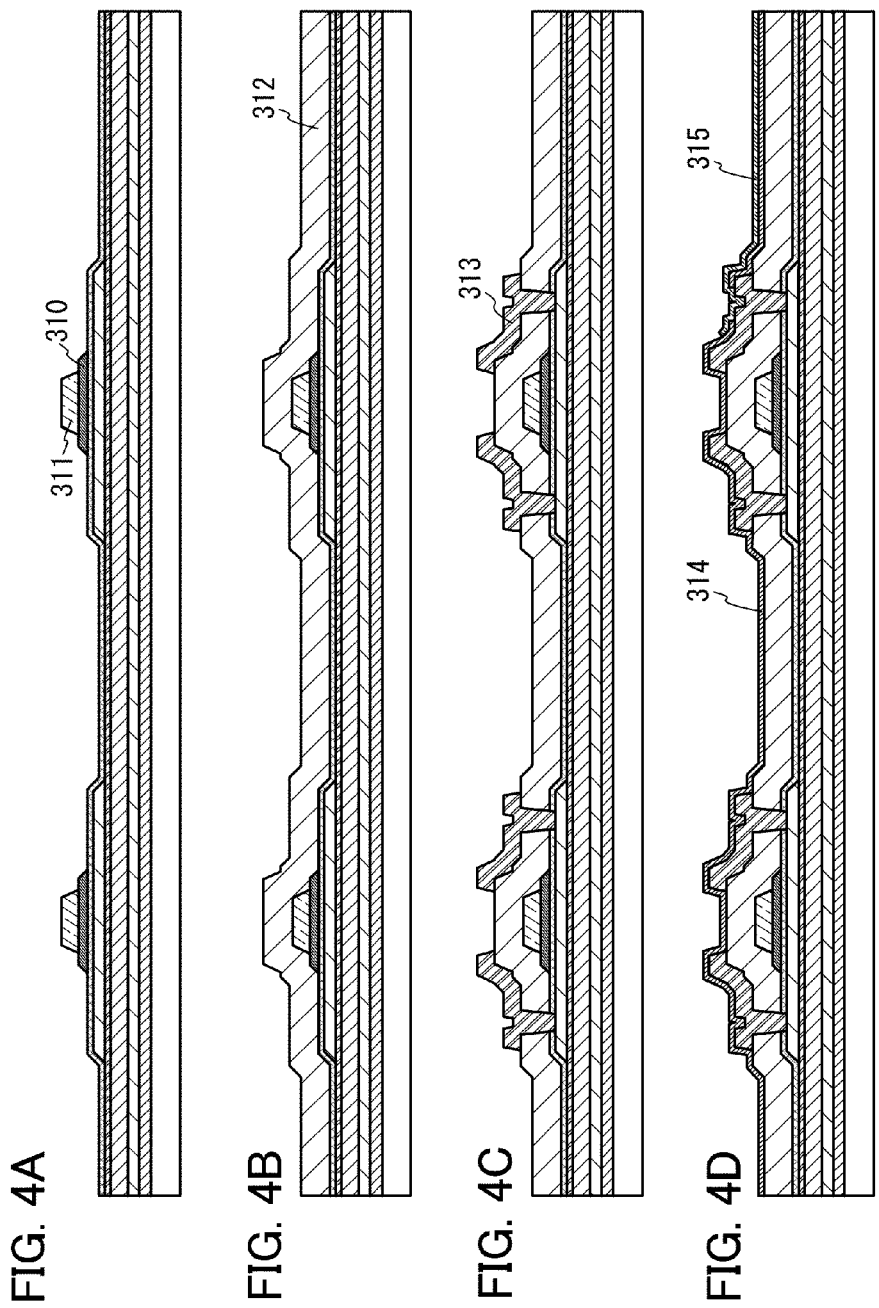

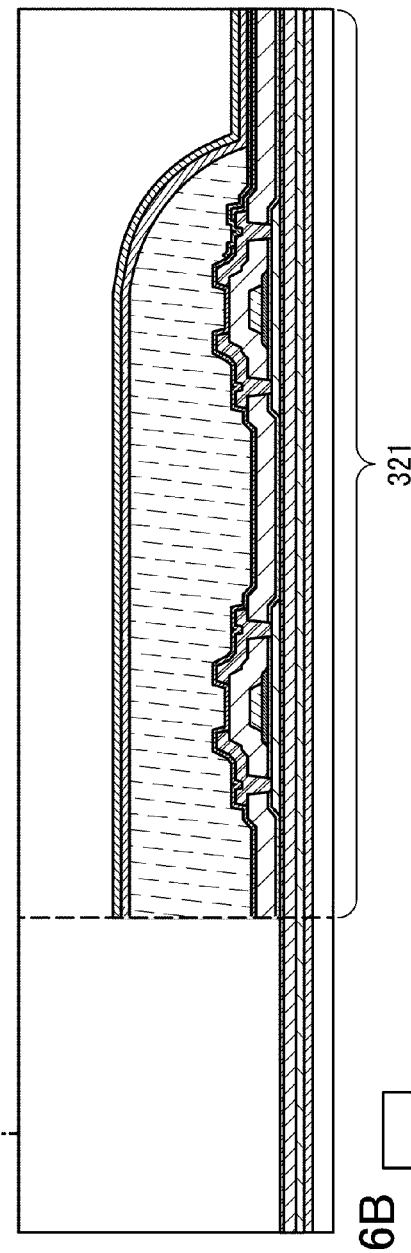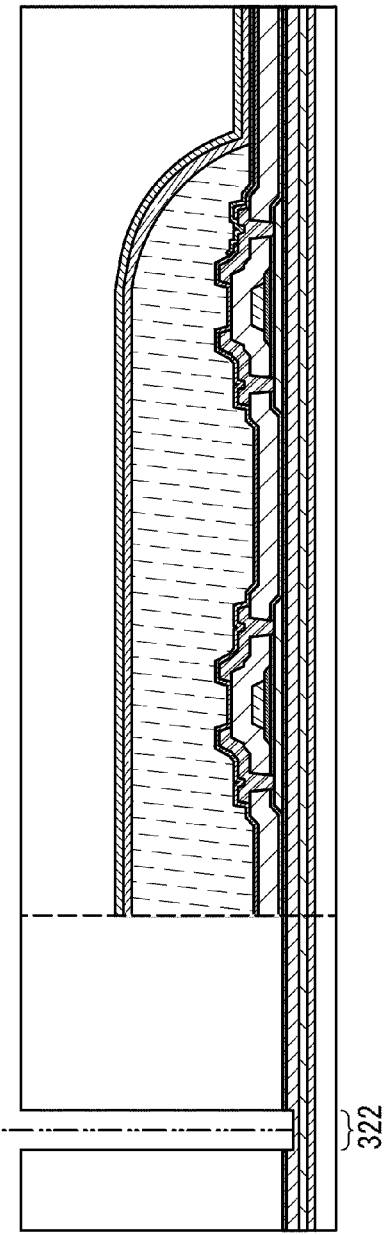

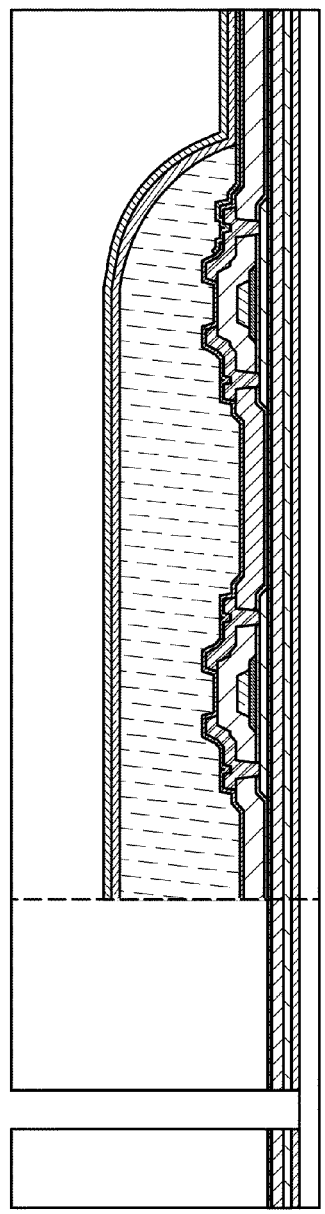
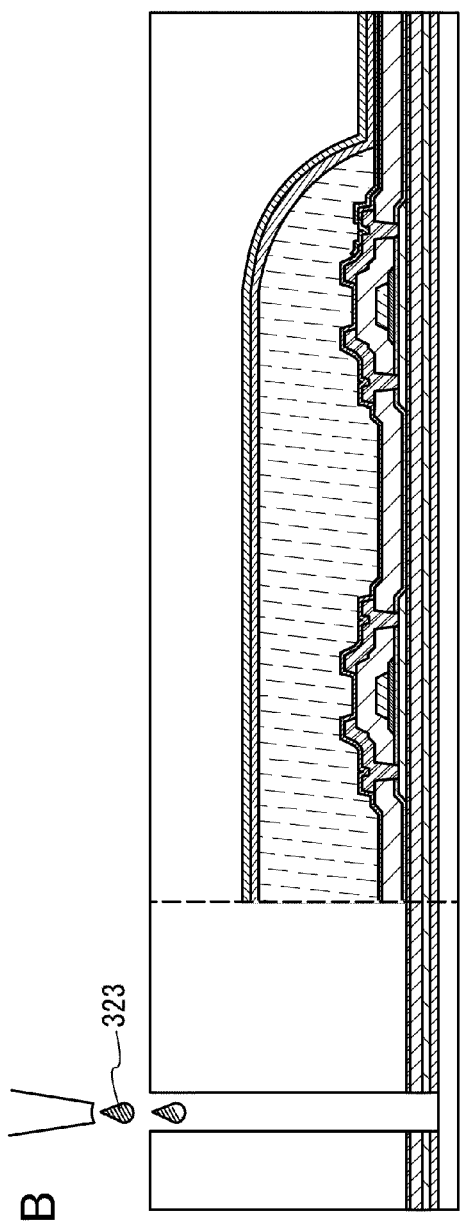
FIG. 8A
FIG. 8B
323

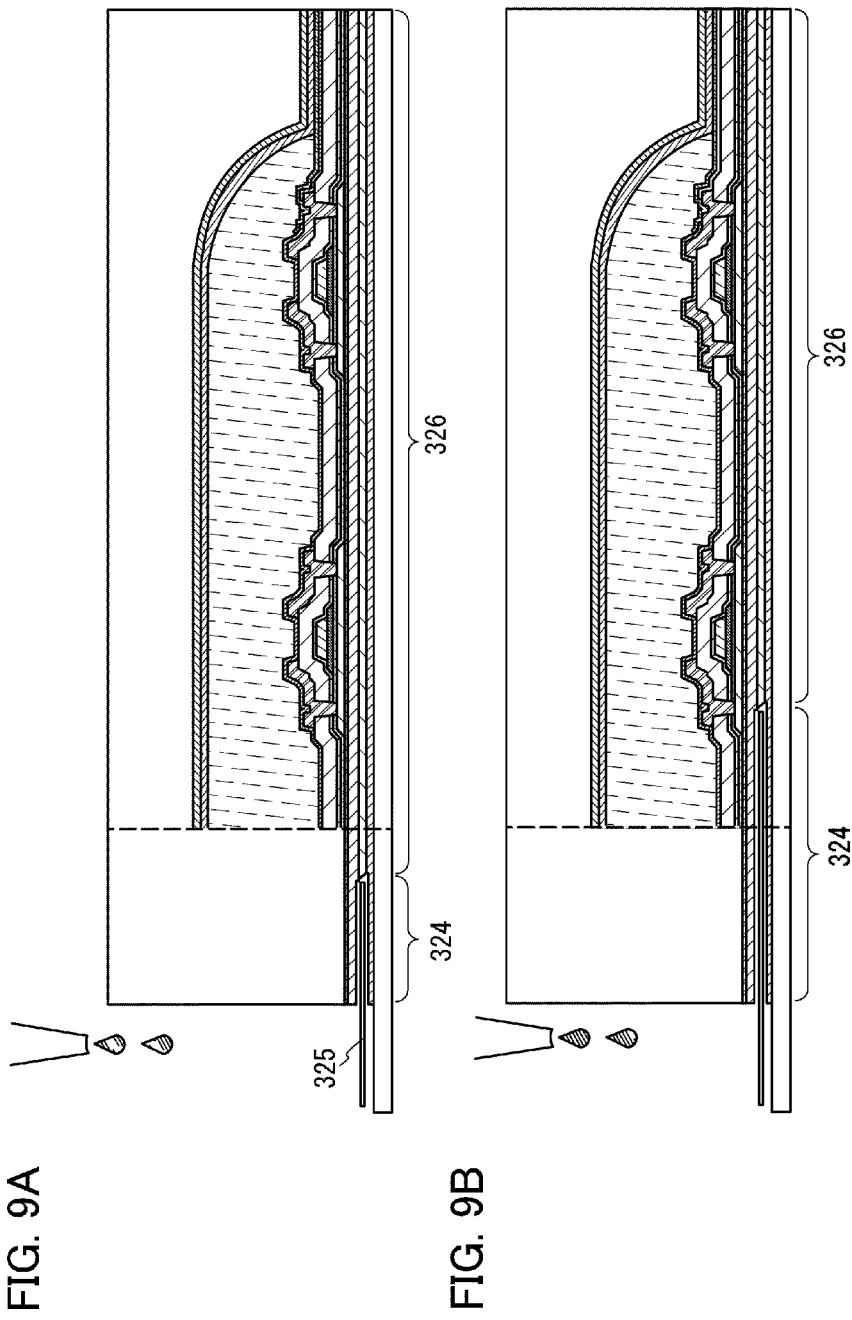

METHOD FOR MANUFACTURING FLEXIBLE SEMICONDUCTOR DEVICE

BACKGROUND OF THE INVENTION

1. Field of the Invention

The present invention relates to a method for manufacturing a flexible semiconductor device.

Note that in this specification, the term "semiconductor device" refers to general devices which can function by utilizing semiconductor properties, and display devices using liquid crystal, electroluminescence (EL), or the like, semiconductor circuits, and electronic devices are all defined as semiconductor devices.

2. Description of the Related Art

In recent years, techniques for manufacturing semiconductor devices have remarkably developed. In particular, techniques for making semiconductor devices thin and flexible have been attracting attention.

As a method for manufacturing a flexible semiconductor device, a technique in which after a semiconductor element such as a thin film transistor (TFT) is formed over a base material such as a glass substrate or a quartz substrate, the semiconductor element is transferred from the base material to another base material (for example, a flexible base material) has developed. In order to transfer the semiconductor element to another base material, a step for separating the semiconductor element from the base material that is used in forming the semiconductor element is necessary.

Examples of methods for making semiconductor devices, particularly, light-emitting devices flexible in a separation step are given below.

The first method is a method in which an EL layer is formed after separation and transfer. For example, a resin for assisting in separation, which functions as a support, is applied to a top surface of a TFT substrate provided with a separation layer. Next, a trigger for separation is given to separate a substrate which is used in forming a TFT. After that, a flexible substrate is attached to a separation surface and the resin for assisting in separation is removed. Then, an EL layer is formed above the TFT and sealing is conducted.

The second method is a method in which an electrode, a partition wall, an EL layer, and the like are formed over a separation surface after separation. For example, a resin for assisting in separation, which functions as a support, is applied to a top surface of a TFT substrate provided with a separation layer. Next, a trigger for separation is given to separates a substrate which is used in forming a TFT. Then, a contact hole is formed on a separation surface, and indium oxide-tin oxide (ITO: indium tin oxide) is formed so as to be electrically connected to a drain of the TFT and patterned to form an electrode. After that, a partition wall and an EL layer are formed and a film and the like are attached for sealing. With the use of this method, light-emitting devices in which the film is attached to a bottom surface and the resin for assisting in separation is formed on a top surface can be obtained.

The third method is a method in which after an electrode, an EL layer, a resin for assisting in separation, and the like are formed, separation is conducted.

In the first method, steps for applying and removing the resin for assisting in separation are necessary. Thus, the number of steps is increased. In the second method, at least three photolithography steps (formation of the contact hole, patterning of the ITO, and formation of the partition wall) are necessary. Thus, the technical hurdle is high. Therefore, the number of steps in the third method is smaller than those in the first method and the second method, and it can be said that the third method is suitable for mass production.

As a method for separating the semiconductor element typified by a light-emitting element from the base material that is used in forming the semiconductor element, there is a method in which a separation layer is formed and a semiconductor element is separated along the separation layer. First, a separation layer is formed over a base material, and a semiconductor element film is formed over the separation layer. After that, the semiconductor element film is separated along the separation layer by applying physical force. Separation is conducted in such a manner, and the semiconductor element is made flexible.

For example, Patent Document 1 discloses a separation technique using laser ablation, which is described below. A separation layer is formed using amorphous silicon or the like over a substrate, a layer to be separated is formed using a thin film element over the separation layer, and the layer to be separated is bonded to a transfer object by using a bonding layer. The separation layer is ablated by laser irradiation, so that separation is generated in the separation layer.

In addition, Patent Document 2 discloses a technique in which separation is conducted by physical force such as human hands. In Patent Document 2, a metal layer is formed between a substrate and an oxide layer and separation is generated at an interface between the oxide layer and the metal layer by utilizing weak bonding between the oxide layer and the metal layer at the interface, so that the layer to be separated and the substrate are separated from each other.

In the case where separation is conducted by physical force such as human hands, the layer to be separated needs to be curved in order to separate the layer to be separated from the base material along the separation layer. The layer to be separated formed in contact with the separation layer is a very fragile thin film with a thickness of about 10 μm in which semiconductor elements including a thin film transistor (TFT), a wiring, an interlayer film, and the like are formed. When the bending stress is applied to the semiconductor elements, the layer to be separated is easily broken and cracked, which causes malfunctions such as breaking of the semiconductor elements frequently.

When separation is conducted, a portion where adhesion between the separation layer and the layer to be separated which are formed over the base material is weakest is preferentially separated. Therefore, adhesion at an interface between the base material and the separation layer or an interface between the separation layer and the layer to be separated needs to be weakest in a stacked-layer body including from the base material to the layer to be separated in order to start separation at the interface between the base material and the separation layer, at the interface between the separation layer and the layer to be separated, or inside the separation layer without separating a stacked film included in the layer to be separated.

Further, when the separation layer is a stacked film, separation can be conducted at the interface between the base material and the separation layer, at the interface between the separation layer and the layer to be separated, or inside the separation layer even if adhesion at interfaces between films included in the separation layer is weakest.

If adhesion between the base material and the separation layer, adhesion between the separation layer and the layer to be separated, or adhesion between films included in the separation layer is too weak, separation might be generated due to the stress of the film in the step in which separation is not expected to be conducted (in a step other than the separation step). Therefore, a process in which the separation layer keeps adhesion to some degree until just before the separation step and adhesion of the separation layer is intentionally reduced by conducting some sort of process in the separation step is preferable.

[Citation List]
[Patent Document 1] Japanese Published Patent Application No. H10-125931
[Patent Document 2] Japanese Published Patent Application No. 2003-174153

SUMMARY OF THE INVENTION

A semiconductor element is formed as a layer to be separated over a separation layer with a buffer layer interposed therebetween and only the semiconductor element is separated and transferred so that a flexible semiconductor device is obtained. In this case, separation is generated inside the semiconductor element. This is because adhesion between films in the semiconductor element is weaker than adhesion between the separation layer and the buffer layer and the films in the semiconductor element are separated from each other before the separation layer and the buffer layer are separated from each other, which are expected to be separated from each other.

The adhesion between the films in the semiconductor element may be improved by changing a method for manufacturing a semiconductor element, changing materials to be used, or applying heat or pressure in a separation step; however, dramatic effects cannot be expected. Thus, a technique for weakening adhesion between the separation layer and the buffer layer is necessary.

Further, it is necessary to prevent generation of the bending stress on the element due to separation.

One embodiment of the present invention is that a semiconductor element formed over a separation layer with a buffer layer interposed therebetween is separated by dissolving the separation layer by using an etchant so as to weaken adhesion between the separation layer and the buffer layer without generating the bending stress on the semiconductor element.

Another embodiment of the present invention includes a structure in which a drawing line is formed by laser irradiation so that a separation layer is easily in contact with an etchant. Note that the term "drawing line" refers to a groove drawn by laser irradiation.

Another embodiment of the present invention is that a film is inserted into a region where a separation layer is dissolved by being in contact with an etchant and the film is moved in a direction toward a region where the separation layer is not dissolved so that separation is conducted without generating the bending stress on a semiconductor element.

Further, another embodiment of the present invention is a method including the steps of: forming a separation layer over a substrate; forming a buffer layer over the separation layer; forming a semiconductor element over the buffer layer; forming a resin layer over the semiconductor element; dissolving the separation layer by using an etchant; inserting a film into a region where the separation layer is dissolved; and separating the semiconductor element from the substrate by moving the film in a direction toward a region where the separation layer is not dissolved without generating the bending stress on the semiconductor element.

Furthermore, another embodiment of the present invention is a method including the steps of: forming a first buffer layer over a substrate; forming a separation layer over the first buffer layer; forming a second buffer layer over the separation layer; forming a semiconductor element over the second buffer layer; forming a resin layer over the semiconductor element; dissolving the separation layer by using an etchant; inserting a film into a region where the separation layer is dissolved; and separating the semiconductor element from the substrate by moving the film in a direction toward a region where the separation layer is not dissolved without generating the bending stress on the semiconductor element.

Still another embodiment of the present invention is a method including the steps of: forming a separation layer over a substrate; forming a buffer layer over the separation layer; forming a semiconductor element over the buffer layer; forming a resin layer over the semiconductor element; forming a drawing line in the buffer layer and the resin layer by performing laser irradiation so as to surround the semiconductor element; dissolving the separation layer along the drawing line by using an etchant; inserting a film into a region where the separation layer is dissolved; and separating the semiconductor element from the substrate by moving the film in a direction toward a region where the separation layer is not dissolved without generating the bending stress on the semiconductor element.

Yet another embodiment of the present invention is a method including the steps of: forming a first buffer layer over a substrate; forming a separation layer over the first buffer layer; forming a second buffer layer over the separation layer; forming a semiconductor element over the second buffer layer; forming a resin layer over the semiconductor element; forming a drawing line in the first buffer layer, the second buffer layer, and the resin layer by performing laser irradiation so as to surround the semiconductor element; dissolving the separation layer along the drawing line by using an etchant; inserting a film into a region where the separation layer is dissolved; and separating the semiconductor element from the substrate by moving the film in a direction toward a region where the separation layer is not dissolved without generating the bending stress on the semiconductor element.

In the case where a semiconductor device is manufactured by a conventional method, separation cannot be conducted on the whole surface; however, the semiconductor device can be made flexible by forming a semiconductor element over a glass substrate and then conducting separation on the whole surface. Further, the separation layer is dissolved, so that adhesion between the separation layer and the buffer layer can be weakened. Thus, separation can be conducted without generating the bending stress on the semiconductor element. As compared with other separation processes, reduction in the number of steps and simplification of the alignment step can be realized.

Furthermore, a film is inserted into a region where a separation layer is dissolved and the film is moved in a direction toward a region where the separation layer is not dissolved, so that separation can be conducted more efficiently without generating the bending stress on the semiconductor element.

In addition, when separation is generated, the semiconductor element or the like might be broken due to the influence of electric discharge of static electricity (electrostatic discharge); however, the breaking due to the electrostatic discharge can be prevented because an etchant is used.

BRIEF DESCRIPTION OF THE DRAWINGS

In the accompanying drawings.

FIGS. 4A to 4D are drawings illustrating Embodiment 4 and Example 2;

FIGS. 6A and 6B are drawings illustrating Embodiment 4 and Example 2;

FIGS. 8A and 8B are drawings illustrating Embodiment 4 and Example 2;

FIGS. 9A and 9B are drawings illustrating Embodiment 4 and Example 2;

DETAILED DESCRIPTION OF THE INVENTION

Embodiments of the present invention will be described below with reference to the accompanying drawings. Note that it is readily appreciated by those skilled in the art that modes and details of the present invention can be modified in a variety of ways without departing from the spirit and scope of the present invention. Therefore, the present invention should not be construed as being limited to the following description of the embodiments.

Embodiment 1

In this embodiment, a method for manufacturing a flexible semiconductor device (especially, a separation step) is described.

Figure 1A:
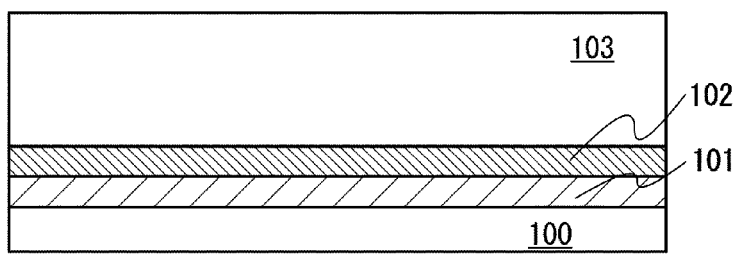
FIGS. 1A to 1D are drawings illustrating Embodiment 1.

FIG. 1A illustrates a structure of an element before separation. A separation layer 101 and a semiconductor element layer 102 are formed over a substrate 100. An ultraviolet curable resin 103 is formed over the semiconductor element layer 102.

The separation layer 101 is formed using a metal material. As the metal material, a material which is soluble in an alkaline solution is preferably used. As examples of such a metal material, tungsten (W), titanium (Ti), aluminum (Al), or tin (Sn) can be used. A thin film can be formed using tungsten (W), titanium (Ti), aluminum (Al), or tin (Sn) as the separation layer 101 over the substrate 100 by a sputtering method, a plasma CVD method, a coating method, a printing method, or the like.

The semiconductor element layer 102 includes a thin film transistor (TFT) and the like. The thin film transistor can have any shape and can be formed by any method.

Figure 1B:
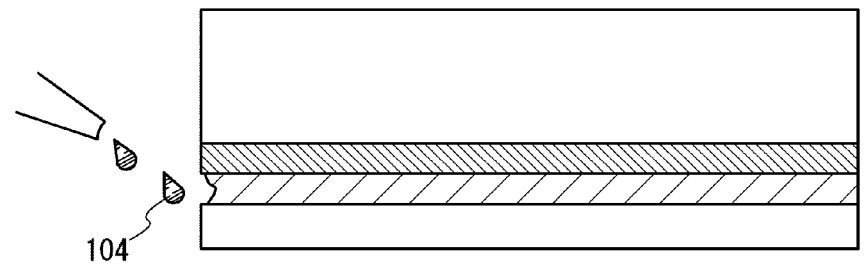

Next, the separation layer 101 is dissolved by using an etchant 104 (FIG. 1B). An alkaline solution is used as the etchant 104. It is preferable that the material of the alkaline solution can dissolve (can etch) the metal material used for the separation layer 101. As examples of such an alkaline solution, a mixture solution containing ammonia and hydrogen peroxide, tetramethylammonium hydroxide (TMAH), a mixture solution containing TMAH and hydrogen peroxide, and the like can be given.

In the case where a material which is not dissolved when the material is the elemental metal and is dissolved when the material is oxidized (for example, tungsten (W)) is used for the separation layer 101, a mixture solution containing hydrogen peroxide is preferably used as the etchant. In addition, in the case where a material which is dissolved when the material is the elemental metal and is not dissolved when the material is oxidized (for example, aluminum (Al)) is used for the separation layer 101, a mixture solution not containing hydrogen peroxide is preferably used as the etchant.

Adhesion between the substrate 100 and the separation layer 101 or adhesion between the separation layer 101 and the semiconductor element layer 102 can be weakened by dissolving the separation layer 101 by using the etchant 104 as described above. Moreover, because the separation layer 101 can be completely dissolved, separation can be conducted without curving the formed semiconductor element and the substrate can be reused.

Figure 1C:
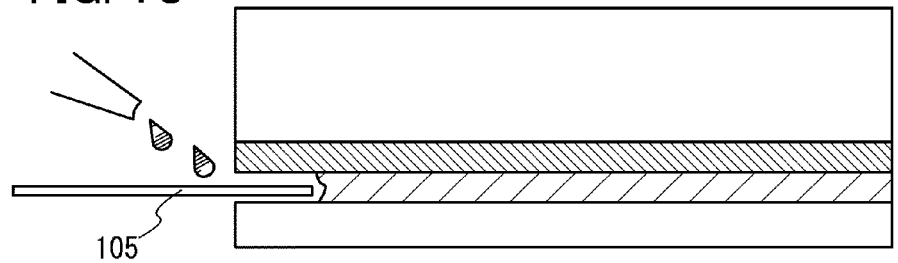

Then, a film 105 is inserted into a region where the separation layer 101 is dissolved (FIG. 1C). Polyethylene naphthalate (PEN) or the like is used for the film 105.

Note that although not illustrated, in actual fact, end portions of the semiconductor element layer 102 and the ultraviolet curable resin 103 are lifted about several millimeters when the separation layer 101 is dissolved by using the etchant 104. The film 105 is inserted into the lifted portions.

Figure 1D:
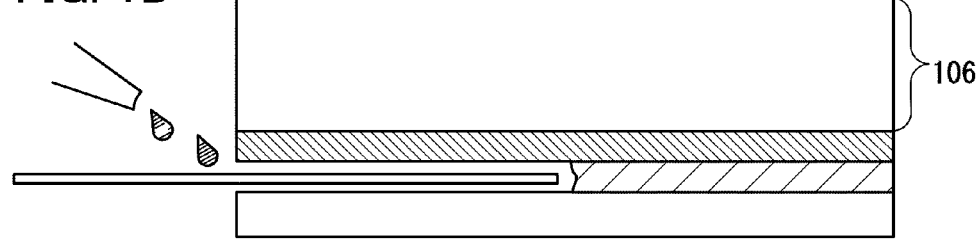

The film 105 is moved in a direction toward a region where separation does not progress while the etchant 104 is added to the region where the separation layer 101 is dissolved so as to remove the separation layer 101 (FIG. 1D). The film 105 is inserted, and the separation layer 101 is dissolved by using the etchant 104 at the same time as movement of the film 105, so that separation can be conducted efficiently without generating the bending stress on the semiconductor element.

In the conventional separation method, even if the separation layer 101 is dissolved as described in this embodiment, a transfer object 106 needs to be curved when the transfer object 106 which includes the ultraviolet curable resin 103 as a support is separated from the substrate 100. In this method, the semiconductor element layer 102 might be broken. In this embodiment, the film 105 is inserted into the region where the separation layer 101 is dissolved by using the etchant 104 so as to remove the dissolved separation layer. Moreover, the region where separation of the separation layer 101 does not progress is made in contact with the etchant 104 through the film 105 so as to further dissolve the separation layer. In such a manner, the film 105 is moved in a direction toward the region where separation does not progress so as to remove the separation layer 101; thus, separation can be conducted without curving the semiconductor element layer 102.

By combining the method in which the separation layer is dissolved by using the etchant with the method in which the film is moved for separation, separation can be conducted more efficiently.

In this method, separation progresses while the etchant is added; thus, the breaking due to the electrostatic discharge can be prevented.

In addition, in the case where adhesion inside the separation layer is weaker than adhesion between the films in the semiconductor element layer, separation can be conducted only in the step in which the film is moved without adding the etchant. Also in this case, separation can be conducted without generating the bending stress on the semiconductor element.

Note that the structure described in this embodiment can be combined with the structure described in any of the other embodiments or examples in this specification as appropriate.

Embodiment 2

In this embodiment, a method for manufacturing a flexible light-emitting device (especially, a separation step) is described.

Figure 2A:
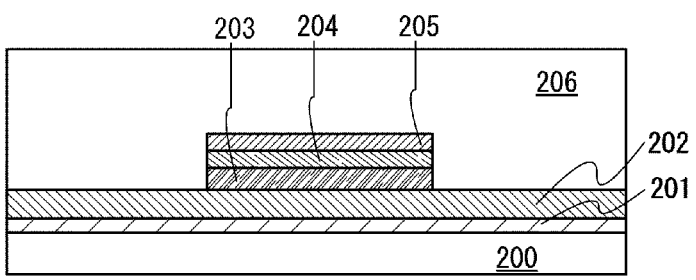
FIGS. 2A to 2D are drawings illustrating Embodiment 2.

FIG. 2A illustrates a structure of an element before separation. A separation layer 201 and an element layer 202 are formed over a substrate 200. The element layer 202 includes a thin film transistor (TFT) and the like. A first electrode 203 and an EL layer 204 are formed over the element layer 202. The EL layer 204 includes a hole injection layer, a hole transport layer, a light-emitting layer, an electron transport layer, an electron injection layer, and the like. A second electrode 205 and an ultraviolet curable resin 206 are formed over the EL layer 204. Note that in the following description of this embodiment, the first electrode 203 functions as an anode and the second electrode 205 functions as a cathode. Further, the semiconductor element layer 102 in Embodiment 1 includes the element layer 202, the first electrode 203, the EL layer 204, and the second electrode 205 in this embodiment.

The separation layer 201 is formed using a metal material. As the metal material, a material which is soluble in an alkaline solution is preferably used. As examples of such a metal material, tungsten (W), titanium (Ti), aluminum (Al), or tin (Sn) can be used. A thin film can be formed using tungsten (W), titanium (Ti), aluminum (Al), or tin (Sn) as the separation layer 201 over the substrate 200 by a sputtering method, a plasma CVD method, a coating method, a printing method, or the like.

The first electrode 203 is preferably formed using any of a metal, an alloy, or a conductive compound, a mixture thereof, or the like with a high work function (specifically, 4.0 eV or more). Specifically, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like can be used, for example. Such conductive metal oxide films are usually formed by a sputtering method, but may also be formed by application of a sol-gel method or the like.

For example, indium oxide-zinc oxide (IZO) can be formed using a target in which zinc oxide is mixed in indium oxide at 1 wt % to 20 wt % by a sputtering method. Indium oxide containing tungsten oxide and zinc oxide (IWZO) can be formed using a target in which tungsten oxide and zinc oxide are mixed in indium oxide at 0.5 wt % to 5 wt % and at 0.1 wt % to 1 wt %, respectively, by a sputtering method. Other than these, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like can be given.

The second electrode 205 can be formed using any of a metal, an alloy, or a conductive compound, a mixture thereof, or the like with a low work function (specifically, 3.8 eV or less). As specific examples of such a cathode material, an element which belongs to Group 1 or 2 in the periodic table, that is, an alkali metal such as lithium (Li) or cesium (Cs); an alkaline earth metal such as magnesium (Mg), calcium (Ca), or strontium (Sr); an alloy containing the element which belongs to Group 1 or 2 (such as MgAg and AlLi); a rare-earth metal such as europium (Eu) or ytterbium (Yb); an alloy thereof; or the like can be used.

Figure 2B:
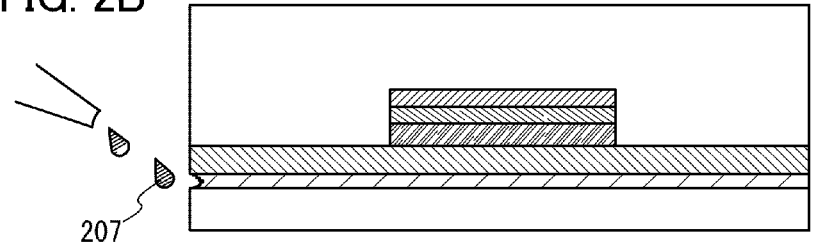

Next, the separation layer 201 is dissolved by using an etchant 207 (FIG. 2B). An alkaline solution is used as the etchant 207. It is preferable that the material of the alkaline solution can dissolve (can etch) the metal material used for the separation layer 201. As examples of such an alkaline solution, a mixture solution containing ammonia and hydrogen peroxide, tetramethylammonium hydroxide (TMAH), a mixture solution containing TMAH and hydrogen peroxide, and the like can be given.

In the case where a material which is not dissolved when the material is the elemental metal and is dissolved when the material is oxidized (for example, tungsten (W)) is used for the separation layer 201, a mixture solution containing hydrogen peroxide is preferably used as the etchant. In addition, in the case where a material which is dissolved when the material is the elemental metal and is not dissolved when the material is oxidized (for example, aluminum (Al)) is used for the separation layer 201, a mixture solution not containing hydrogen peroxide is preferably used as the etchant.

By dissolving the separation layer 201 by using the etchant 207 as described above, separation can be conducted from the substrate 200 without generating separation at an interface between the EL layer 204 and the second electrode 205 even if an element in which adhesion between the EL layer 204 and the second electrode 205 is weak is used. Moreover, the separation layer 201 can be dissolved; thus, separation can be conducted without curving the formed light-emitting element and the substrate can be reused.

Figure 2C:
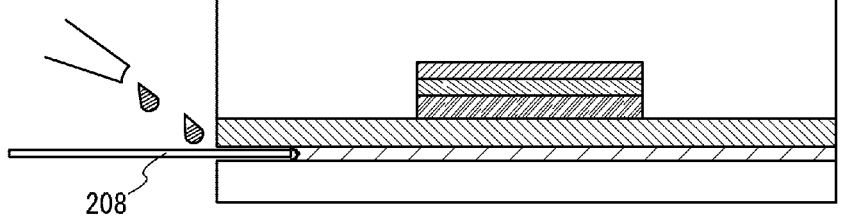

Then, a film 208 is inserted into a region where the separation layer 201 is dissolved (FIG. 2C). Polyethylene naphthalate (PEN) or the like is used for the film 208.

Note that although not illustrated, in actual fact, end portions of the element layer 202 and the ultraviolet curable resin 206 are lifted about several millimeters when the separation layer 201 is dissolved by using the etchant 207. The film 208 is inserted into the lifted portions.

Figure 2D:
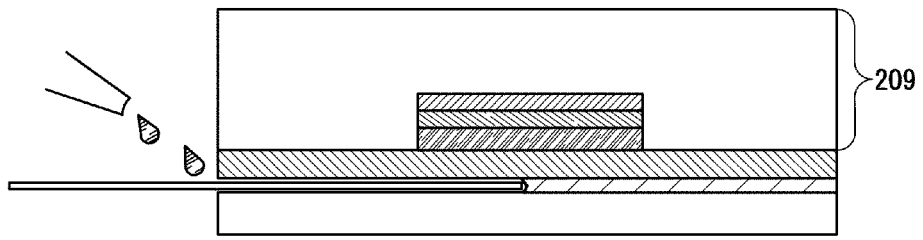

The film 208 is moved in a direction toward a region where separation does not progress while the etchant 207 is added to the region where the separation layer 201 is dissolved so as to remove the separation layer 201 (FIG. 2D). The film 208 is inserted, and the separation layer 201 is dissolved by using the etchant 207 at the same time as movement of the film 208, so that separation can be conducted efficiently without generating the bending stress on the light-emitting element.

In the conventional separation method, even if the separation layer 201 is dissolved as described in this embodiment, a transfer object 209 needs to be curved when the transfer object 209 which includes the ultraviolet curable resin 206 as a support is separated from the substrate 200. In this method, the element layer 202 and the EL layer 204 might be broken. In this embodiment, the film 208 is moved in a direction toward the region where separation does not progress so as to remove the separation layer 201; thus, separation can be conducted without curving the element layer 202 and the EL layer 204.

By combining the method in which the separation layer is dissolved by using the etchant with the method in which the film is moved for separation, separation can be conducted more efficiently.

In this method, separation progresses while the etchant is added; thus, the breaking due to the electrostatic discharge can be prevented.

In addition, in the case where adhesion between the substrate and the separation layer is weaker than adhesion between the films in the semiconductor element layer, separation can be conducted only in the step in which the film is moved without adding the etchant. Also in this case, separation can be conducted without generating the bending stress on the semiconductor element.

Although an active matrix light-emitting device is described in this embodiment, this embodiment can also be applied to a passive matrix light-emitting device.

Although a light-emitting device is described in this embodiment, this embodiment can be applied to all semiconductor devices that can function by utilizing semiconductor properties, such as liquid crystal display devices, semiconductor circuits, and electronic devices.

Note that the structure described in this embodiment can be combined with the structure described in any of the other embodiments or examples in this specification as appropriate.

Embodiment 3

In this embodiment, an ultraviolet curable resin used for separation of a flexible light-emitting device is described.

A separation step is conducted after a base material which functions as a support is provided above an element layer formed over a substrate so as to hold the element layer. In the case of a light-emitting device, a light-emitting element is deteriorated by water and oxygen and dissolved when in contact with an organic solvent; thus, it is particularly necessary to consider materials to be used also in a separation step.

The ultraviolet curable resin used as a support, which is described in Embodiment 1, can be formed without using a solvent. Further, the ultraviolet curable resin can be formed by heat treatment at 80° C. or lower; thus, the ultraviolet curable resin can be formed without damaging an EL layer.

Moreover, in the case where a light-emitting device having a top emission structure is manufactured, the base material used as a support needs to have high transmittance. The ultraviolet curable resin is suitable because the ultraviolet curable resin has high transmittance.

Although a light-emitting device is described in this embodiment, this embodiment can be applied to all semiconductor devices that can function by utilizing semiconductor properties, such as liquid crystal display devices, semiconductor circuits, and electronic devices.

Note that the structure described in this embodiment can be combined with the structure described in any of the other embodiments or examples in this specification as appropriate.

Embodiment 4

In this embodiment, a method for manufacturing a flexible light-emitting device is described with reference to FIGS. 3A to 3D, FIGS. 4A to 4D, FIGS. 5A and 5B, FIGS. 6A and 6B, FIGS. 7A and 7B, FIGS. 8A and 8B, and FIGS. 9A and 9B.

Figure 3A:
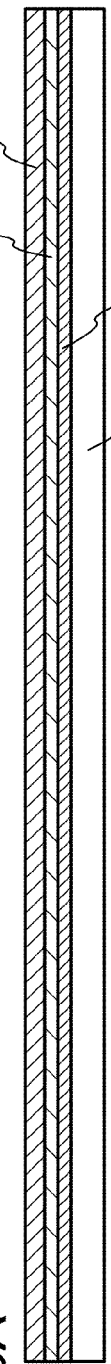
FIGS. 3A to 3D are drawings illustrating Embodiment 4 and Example 2.

A first buffer layer 301, a separation layer 302, and a second buffer layer 303 are formed over a glass substrate 300 (FIG. 3A). The first buffer layer 301 is formed using an insulating material. As an example of the insulating material, silicon oxynitride and the like can be used.

The separation layer 302 is formed using a metal material. As the metal material, a material which is soluble in an alkaline solution is preferably used. As examples of such a metal material, tungsten (W), titanium (Ti), aluminum (Al), or tin (Sn) can be used.

The second buffer layer 303 is formed using an insulating material. As examples of the insulating material, silicon nitride, silicon oxynitride, silicon nitride oxide, and the like can be used. Further, the second buffer layer 303 may have a single-layer structure or a stacked structure, and the total thickness of the second buffer layer 303 is preferably about 1000 nm or more. A structure in which a silicon oxynitride film with a thickness of 600 nm, a silicon nitride film with a thickness of 200 nm, and a silicon oxynitride film with a thickness of 200 nm are stacked in this order and the like is suitable, for example.

In this specification, silicon oxynitride contains more oxygen than nitrogen and, in the case where measurements are performed using rutherford backscattering spectrometry (RBS) and hydrogen forward scattering (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are performed using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Figure 3B:
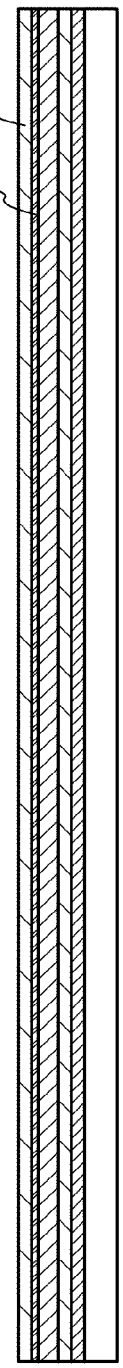

A base insulating film 304 and a crystalline semiconductor film 305 are formed over the second buffer layer 303 (FIG. 3B). The base insulating film 304 can be formed using a stacked film of silicon nitride oxide and silicon oxynitride, or the like. The crystalline semiconductor film 305 can be formed using a crystalline semiconductor which is formed by irradiating an amorphous semiconductor with a laser beam.

Figure 3C:
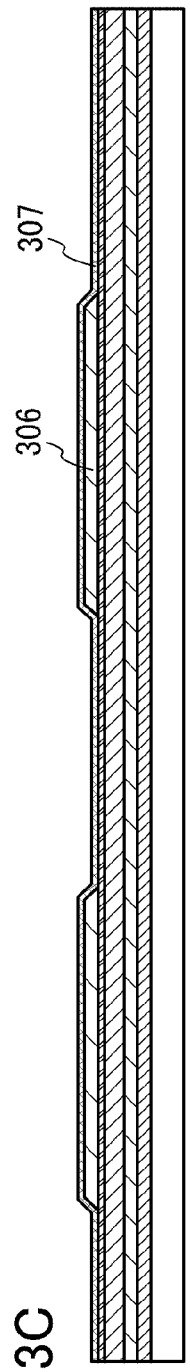

The formed crystalline semiconductor film 305 is etched to form an island-shaped semiconductor layer 306. Next, a gate insulating film 307 is formed over the exposed base insulating film 304 and the island-shaped semiconductor layer 306 (FIG. 3C). The gate insulating film 307 can be formed using silicon oxynitride or the like.

Figure 3D:
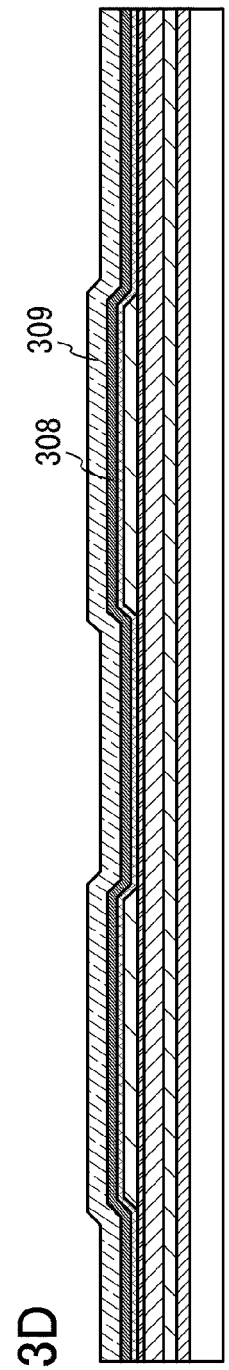

Then, a first gate electrode layer 308 and a second gate electrode layer 309 are formed (FIG. 3D).

After that, the first gate electrode layer 308 and the second gate electrode layer 309 are etched to form a first gate electrode 310 and a second gate electrode 311 (FIG. 4A). The first gate electrode 310 can be formed using tantalum nitride, and the second gate electrode 311 can be formed using tungsten (W) or the like.

Next, a first interlayer insulating film 312 is formed over the first gate electrode 310 and the second gate electrode 311 (FIG. 4B). The first interlayer insulating film 312 may have a single-layer structure or a stacked structure. A film in which silicon oxynitride, silicon nitride, silicon oxynitride, and the like are stacked can be given, for example.

Next, a contact hole is formed in the gate insulating film 307 and the first interlayer insulating film 312. After that, a wiring 313 is formed so as to be electrically connected to the island-shaped semiconductor layer 306 through the aforementioned contact hole (FIG. 4C). The wiring 313 may have a single-layer structure or a stacked structure. A structure in which titanium (Ti), aluminum (Al), and titanium (Ti) are stacked in this order and the like can be given, for example.

Next, a second interlayer insulating film 314 is formed and a contact hole is formed so as to expose a part of the wiring 313. The second interlayer insulating film 314 is preferably formed using silicon oxynitride. Then, a first electrode layer is formed so as to be electrically connected to the wiring 313 through the contact hole in the second interlayer insulating film 314. The first electrode layer is etched to have a desired shape so that a first electrode 315 is formed (FIG. 4D).

The first electrode 315 is preferably formed using any of a metal, an alloy, or a conductive compound, a mixture thereof, or the like with a high work function (specifically, 4.0 eV or more). Specifically, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like can be used, for example. Such conductive metal oxide films are usually formed by a sputtering method, but may also be formed by application of a sol-gel method or the like.

For example, indium oxide-zinc oxide (IZO) can be formed using a target in which zinc oxide is mixed in indium oxide at 1 wt % to 20 wt % by a sputtering method. Indium oxide containing tungsten oxide and zinc oxide (IWZO) can be formed using a target in which tungsten oxide and zinc oxide are mixed in indium oxide at 0.5 wt % to 5 wt % and at 0.1 wt % to 1 wt %, respectively, by a sputtering method. Other than these, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like can be given.

Figure 5A:
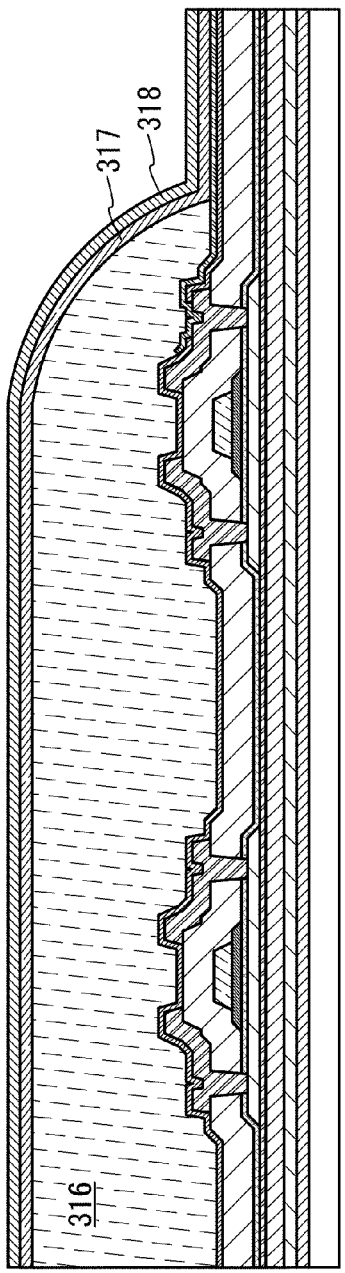
FIGS. 5A and 5B are drawings illustrating Embodiment 4 and Example 2.

A partition wall 316 is formed so as to cover an end portion of the first electrode 315. The partition wall 316 can be formed using an organic resin such as polyimide. Next, an EL layer 317 and a second electrode 318 are formed (FIG. 5A).

The EL layer 317 includes a hole injection layer, a hole transport layer, a light-emitting layer, an electron transport layer, an electron injection layer, a hole blocking layer, and the like. The material used for the EL layer 317 may be selected as appropriate.

The second electrode 318 can be formed using any of a metal, an alloy, or a conductive compound, a mixture thereof, or the like with a low work function (specifically, 3.8 eV or less). As specific examples of such a cathode material, an element which belongs to Group 1 or 2 in the periodic table, that is, an alkali metal such as lithium (Li) or cesium (Cs); an alkaline earth metal such as magnesium (Mg), calcium (Ca), or strontium (Sr); an alloy containing the element which belongs to Group 1 or 2 (such as MgAg and AlLi); a rare-earth metal such as europium (Eu) or ytterbium (Yb); an alloy thereof; or the like can be used.

Figure 5B:
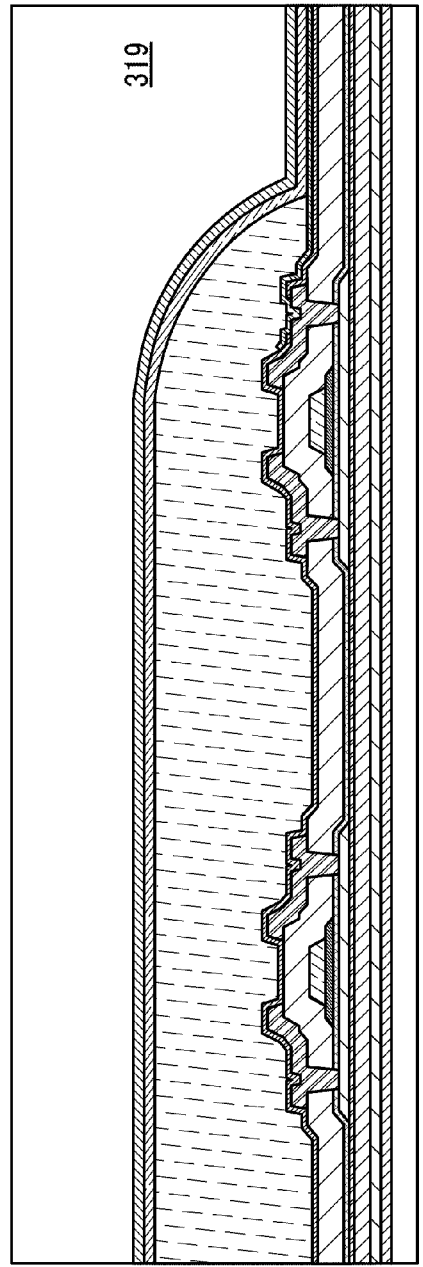

An ultraviolet curable resin 319 is applied so as to cover the formed a light-emitting element (including the first electrode 315, the EL layer 317, and the second electrode 318) (FIG. 5B). The ultraviolet curable resin 319 is irradiated with ultraviolet light to be temporarily cured. Then, heat treatment is performed for full curing. Here, the ultraviolet curable resin 319 improves the mechanical strength of a film to be separated and functions as a support in separation and transport. However, the EL layer 317 has a low resistance to water and an organic solvent; thus, the material which can be formed without using water or an organic solvent needs to be selected. Further, the EL layer 317 has a low heat resistance; thus, the material, which is cured by ultraviolet irradiation treatment and heat treatment at about 80° C. or lower, is used for the ultraviolet curable resin 319 used in this embodiment.

Figure 7A:
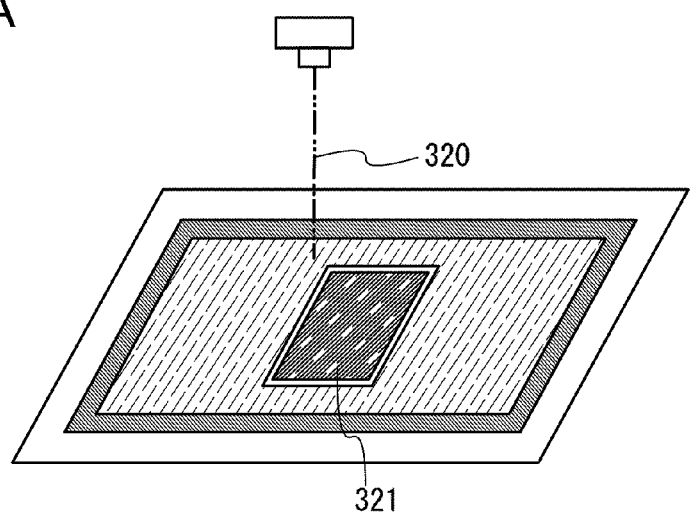
FIGS. 7A and 7B are drawings illustrating Embodiment 4 and Example 2.

Next, an ultraviolet laser beam 320 is used for drawing so as to surround a panel portion 321 (FIG. 6A and FIG. 7A).

Figure 7B:
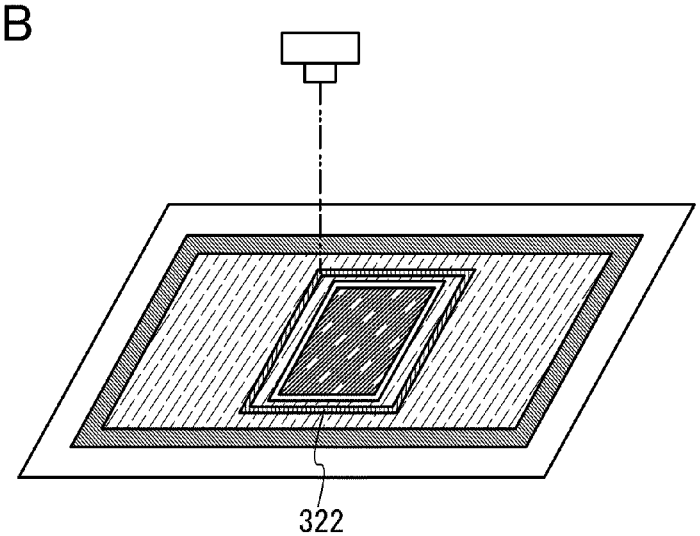

The portion irradiated with the laser beam is melted and the melted material is removed to form a starting point of separation (a drawing line 322) (FIG. 6B and FIG. 7B). The drawing line 322 with a width of about 1 mm is preferably formed. Note that FIGS. 7A and 7B are perspective views illustrating a separation step of the panel portion in which a light-emitting element is formed.

After that, the first buffer layer 301, the separation layer 302, and the second buffer layer 303, which are on the periphery of the drawing line, are removed by a physical means such as a cutter (FIG. 8A). Through this step, a space to be impregnated with an etchant can be surely secured.

An etchant 323 is introduced into the drawing line 322 so that the separation layer 302 is dissolved and partly lifted off (FIG. 8B). An alkaline solution is used as the etchant 323. It is preferable that the material of the alkaline solution can dissolve (can etch) the metal material used for the separation layer 302. As examples of such an alkaline solution, a mixture solution containing ammonia and hydrogen peroxide, tetramethylammonium hydroxide (TMAH), a mixture solution containing TMAH and hydrogen peroxide, and the like can be given.

In the case where a material which is not dissolved when the material is the elemental metal and is dissolved when the material is oxidized (for example, tungsten (W)) is used for the separation layer 302, a mixture solution containing hydrogen peroxide is preferably used as the etchant. In addition, in the case where a material which is dissolved when the material is the elemental metal and is not dissolved when the material is oxidized (for example, aluminum (Al)) is used for the separation layer 302, a mixture solution not containing hydrogen peroxide is preferably used as the etchant.

In the case where the separation layer 302 is formed using tungsten (W) and a mixture solution containing ammonia and hydrogen peroxide is used as the etchant 323, a portion of the separation layer 302, which is in contact with the etchant 323, is dissolved in several seconds. Thus, adhesion between the separation layer 302 and the first buffer layer 301 or adhesion between the separation layer 302 and the second buffer layer 303 can be weakened, and separation can be conducted without generating the bending stress on the light-emitting element.

In FIG. 6B, FIG. 7B, and FIGS. 8A and 8B, the drawing line 322 divides the first buffer layer 301, the separation layer 302, the second buffer layer 303, the base insulating film 304, and the ultraviolet curable resin 319 into two parts; however, the first buffer layer 301, the separation layer 302, the second buffer layer 303, the base insulating film 304, and the ultraviolet curable resin 319 on the left side of the drawing line are omitted in FIGS. 9A and 9B for simplification of drawings.

A gap is generated between the glass substrate 300 and the second buffer layer 303 in a region 324 where lift-off progresses. A film 325 is inserted into the gap (FIG. 9A).

Note that although not illustrated, in actual fact, an end portion of the ultraviolet curable resin 319 is lifted about several millimeters when the separation layer 302 is dissolved by using the etchant 323. The film 325 is inserted into the lifted portion.

The film 325 is moved in a direction toward a region 326 where separation does not progress while the etchant 323 is added so as to extend the lift-off region (FIG. 9B). Polyethylene naphthalate (PEN) or the like can be used for the inserted film 325, for example.

When separation is completed, the attached etchant is cleaned with pure water. Through these steps, a flexible light-emitting device can be manufactured. Any solution may be used to clean the etchant as long as it can clean the etchant.

A color light-emitting device is obtained by a method in which alignment of pixels is conducted and light-emitting materials which emit red (R) light, green (G) light, and blue (B) light are painted in different colors or a method in which a color layer (color filter) is formed. When separation is conducted to make a light-emitting element flexible, it is difficult to conduct an alignment accurately because there causes problems such as a bend or a shrinkage of the surface over which the light-emitting element is formed. In this embodiment, the EL layer, the color layer (color filter), and the like can be formed before the separation step; thus, the color light-emitting device can be easily realized. Moreover, in the case where the separation step is included in a manufacturing step, a transfer needs to be conducted at least twice; however, there is an advantage that the number of the steps in the manufacturing method described in this embodiment is small and a light-emitting device is easily manufactured.

In addition, in this method, separation progresses while the etchant is added; thus, the breaking due to the electrostatic discharge can be prevented.

In addition, in the case where adhesion inside the separation layer is weaker than adhesion between the films in the semiconductor element layer, separation can be conducted only in the step in which the film is moved without adding the etchant. Also in this case, separation can be conducted without generating the bending stress on the semiconductor element.

Although an active matrix light-emitting device is described in this embodiment, the present invention can also be applied to a passive matrix light-emitting device.

Although a light-emitting device is described in this embodiment, this embodiment can be applied to all semiconductor devices that can function by utilizing semiconductor properties, such as liquid crystal display devices, semiconductor circuits, and electronic devices.

Note that the structure described in this embodiment can be combined with the structure described in any of the other embodiments or examples in this specification as appropriate.

Example 1

In this example, an etching rate when a separation layer (tungsten (W)) is etched by using an etchant (a mixture solution containing ammonia and hydrogen peroxide) is described.

First, tungsten (W) was formed to a thickness of 50 nm over a glass substrate. Next, wet etching was conducted using a solution (A) in which hydrogen peroxide water, ammonia water, and water are mixed at a ratio of 5:2:2 and a solution (B) in which hydrogen peroxide water, ammonia water, and water are mixed at a ratio of 5:2:0 as etchants by a dip method. The concentration of the hydrogen peroxide water was 34.5% and the concentration of the ammonia water was 28%. Table 1 shows the result.

TABLE 1

| | etching time (sec) | etching rate (nm/sec) |
|---|---|---|
| solution (A) | 78 | 0.64 |
| solution (B) | 58 | 0.86 |

According to Table 1, it was found that the etching rate of the solution (B) which is not diluted with water was about 1.3 times as high as that of the solution (A). From the result, it was determined that a mixture solution which is not diluted with water was used as an etchant in one embodiment of the present invention.

Note that the structure described in this example can be combined with the structure described in any of the other embodiments or examples in this specification as appropriate.

Example 2

In this example, a method for manufacturing a flexible light-emitting device is described with reference to FIGS. 3A to 3D, FIGS. 4A to 4D, FIGS. 5A and 5B, FIGS. 6A and 6B, FIGS. 7A and 7B, FIGS. 8A and 8B, and FIGS. 9A and 9B.

As the first buffer layer 301, a silicon oxynitride film was formed to a thickness of 100 nm over the glass substrate 300 by a CVD method. Then, a tungsten (W) film with a thickness of 50 nm, a silicon oxynitride film with a thickness of 600 nm, a silicon nitride film with a thickness of 200 nm, and a silicon oxynitride film with a thickness of 200 nm were formed. The tungsten (W) film was provided as the separation layer 302 and the other films were provided as the second buffer layer 303 (FIG. 3A). At this time, it is necessary that the total thickness of the second buffer layer 303 be 1000 nm or more in order to prevent a separation surface from moving to an EL layer.

A silicon nitride oxide film with a thickness of 140 nm and a silicon oxynitride film with a thickness of 100 nm were formed over the second buffer layer 303 as the base insulating film 304.

Next, the crystalline semiconductor film 305 was formed (FIG. 3B). An amorphous semiconductor, a crystalline semiconductor, a microcrystalline semiconductor, and the like can be used as a semiconductor layer. In this example, a crystalline semiconductor which is formed by irradiating an amorphous semiconductor with a laser beam was used.

The formed crystalline semiconductor film 305 was etched to form the island-shaped semiconductor layer 306. Next, the gate insulating film 307 was formed (FIG. 3C). A silicon oxynitride film was formed to a thickness of 110 nm as the gate insulating film 307.

Then, a tantalum nitride film was formed to a thickness of 30 nm as the first gate electrode layer 308 and a tungsten (W) film was formed to a thickness of 370 nm as the second gate electrode layer 309 (FIG. 3D).

After that, the first gate electrode layer 308 and the second gate electrode layer 309 were etched to form the first gate electrode 310 and the second gate electrode 311 (FIG. 4A).

Next, the first interlayer insulating film 312 was formed over the first gate electrode 310 and the second gate electrode 311 (FIG. 4B). The first interlayer insulating film 312 was formed by stacking a silicon oxynitride film with a thickness of 50 nm, a silicon nitride oxide film with a thickness of 140 nm, and a silicon oxynitride film with a thickness of 520 nm in this order.

Next, a contact hole was formed in the gate insulating film 307 and the first interlayer insulating film 312. After that, the wiring 313 was formed so as to be electrically connected to the island-shaped semiconductor layer 306 through the aforementioned contact hole (FIG. 4C). The wiring 313 may have a single-layer structure or a stacked structure. In this example, a titanium (Ti) film with a thickness of 100 nm, an aluminum (Al) film with a thickness of 700 nm, and a titanium (Ti) film with a thickness of 100 nm were stacked in this order.

Next, a silicon oxynitride film was formed to a thickness of 150 nm as the second interlayer insulating film 314. Then, a contact hole was formed so as to expose a part of the wiring 313.

Then, the first electrode layer was formed so as to be electrically connected to the wiring 313 through the contact hole in the second interlayer insulating film 314. The ITSO ($SiO_2$ is included in an ITO) was formed to a thickness of 125 nm as the first electrode layer. The first electrode layer was etched to form the first electrode 315 (FIG. 4D).

The partition wall 316 was formed using polyimide so as to cover the end portion of the first electrode 315. Next, the EL layer 317 and the second electrode 318 were formed (FIG. 5A).

The EL layer 317 includes a hole injection layer, a hole transport layer, a light-emitting layer, an electron transport layer, an electron injection layer, a hole blocking layer, and the like. The material used for the EL layer 317 may be selected as appropriate. In this example, a composite layer including NPB (4,4'-bis[N-(1-naphthyl)-N-phenylamino]biphenyl) and molybdenum oxide was formed to a thickness of 50 nm as the hole injection layer, an NPB layer was formed to a thickness of 10 nm as the hole transport layer, an Alq (tris(8-quinolinolato)aluminum) layer and an coumarin 6 layer were formed to a thickness of 40 nm by co-evaporation as the light-emitting layer, an Alq layer was formed to a thickness of 10 nm as the electron transport layer, and an Alq layer and a cesium carbonate layer were formed to a thickness of 20 nm by co-evaporation as the electron injection layer. The second electrode was formed using aluminum (Al). Note that Alq included in the light-emitting layer is a host material and coumarin 6 included in the light-emitting layer is a guest material.

The ultraviolet curable resin 319 was applied to a thickness of 150 µm so as to cover the formed light-emitting elements (the first electrode 315, the EL layer 317, and the second electrode 318) by using a bar coater (FIG. 5B). The ultraviolet curable resin 319 was formed using an acrylic urethane based resin (Norland NEA121). It can be said that an acrylic urethane based resin is a suitable material for manufacturing a light-emitting device because the acrylic urethane based resin can be baked at a low temperature of 80° C. or lower and its transmittance of visible light is 90% or more.

Next, irradiation with ultraviolet light (having a wavelength of 365 nm) was conducted for three minutes at 20 mW/cm$^2$ for temporary curing. Then, heat treatment was conducted at 80° C. for three hours while a pressure of 0.5 MPa was applied by a pressing machine for full curing.

Next, the ultraviolet laser beam 320 (having a wavelength of 266 nm and an output of 1.8 W) was used for drawing so as to surround a region 321 which functions as a panel (panel portion) (FIG. 6A and FIG. 7A).

The portion irradiated with the laser beam was dissolved; thus, the starting point of separation (the drawing line 322) was able to be formed (FIG. 6B and FIG. 7B). The drawing line 322 with a width of about 1 mm was formed.

After that, the first buffer layer 301, the separation layer 302, and the second buffer layer 303, which are on the periphery of the drawing line 322, were scraped off by a cutter (FIG. 8A). Through this step, a space to be impregnated with a mixture solution containing ammonia and hydrogen peroxide can be surely secured.

Next, the etchant 323 was introduced into the drawing line 322. As the etchant 323, a mixture solution containing ammonia and hydrogen peroxide was used. The separation layer which is in contact with the etchant 323 was dissolved in several seconds and partly lifted off (FIG. 8B).

In FIG. 6B, FIGS. 7A and 7B, and FIGS. 8A and 8B, the drawing line 322 divides the first buffer layer 301, the separation layer 302, the second buffer layer 303, the base insulating film 304, and the ultraviolet curable resin 319 into two parts; however, the first buffer layer 301, the separation layer 302, the second buffer layer 303, the base insulating film 304, and the ultraviolet curable resin 319 on the left side of the drawing line are omitted in FIGS. 9A and 9B for simplification of drawings.

The film 325 was inserted into a gap between the glass substrate 300 and the second buffer layer 303 in the region 324 where lift-off progresses while the etchant 323 is added (FIG. 9A). In this example, a polyethylene naphthalate (PEN) film (having a thickness of 50 µm) was used as the film 325.

Note that although not illustrated, in actual fact, an end portion of the ultraviolet curable resin 319 was lifted about several millimeters when the separation layer 302 was dissolved by using the etchant 323. The film 325 was inserted into the lifted portion.

The film 325 was moved in a direction toward the region 326 where separation does not progress (a region where lift-off does not progress) so as to extend the lift-off region, so that the separation layer was able to be removed (FIG. 9B).

After separation was completed, the attached etchant was cleaned with pure water. Through these steps, a flexible light-emitting device was able to be manufactured.

A color light-emitting device is obtained by a method in which alignment of pixels is conducted and light-emitting materials which emit red (R) light, green (G) light, and blue (B) light are painted in different colors or a method in which a color layer (color filter) is formed. When separation is conducted to make a light-emitting element flexible, it is difficult to conduct an alignment accurately because there causes problems such as a bend or a shrinkage of the surface over which the light-emitting element is formed. In this example, the EL layer, the color layer (color filter), and the like can be formed before the separation step; thus, the color light-emitting device can be easily realized. Moreover, in the case where the separation step is included in a manufacturing step, a transfer needs to be conducted at least twice; however, there is an advantage that the number of the steps in the manufacturing method described in this example is small and a light-emitting device is easily manufactured.

In addition, in this method, separation progresses while the etchant is added; thus, the breaking due to the electrostatic discharge can be prevented.

Although an active matrix light-emitting device is described in this example, the present invention can also be applied to a passive matrix light-emitting device.

Although a light-emitting device is described in this example, this example can be applied to all semiconductor devices that can function by utilizing semiconductor properties, such as liquid crystal display devices, semiconductor circuits, and electronic devices.

Note that the structure described in this example can be combined with the structure described in any of the other embodiments or examples in this specification as appropriate.

Example 3

Figure 12A:
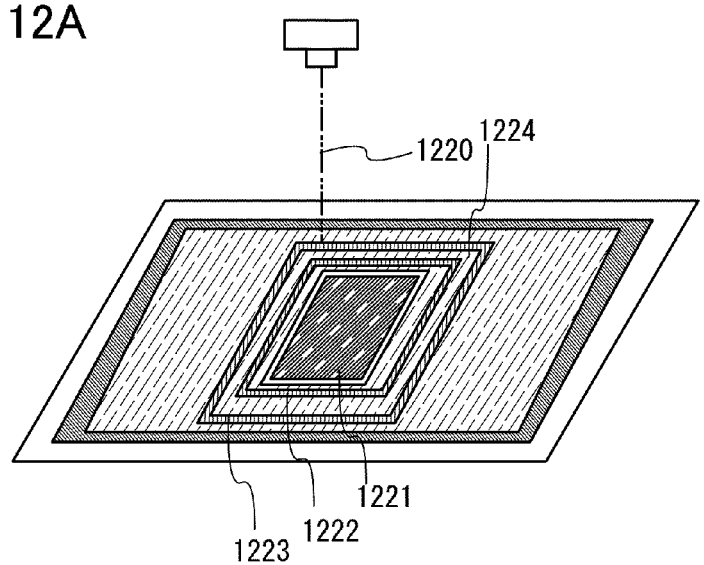
FIGS. 12A and 12B are drawings illustrating Example 3.
Figure 12B:
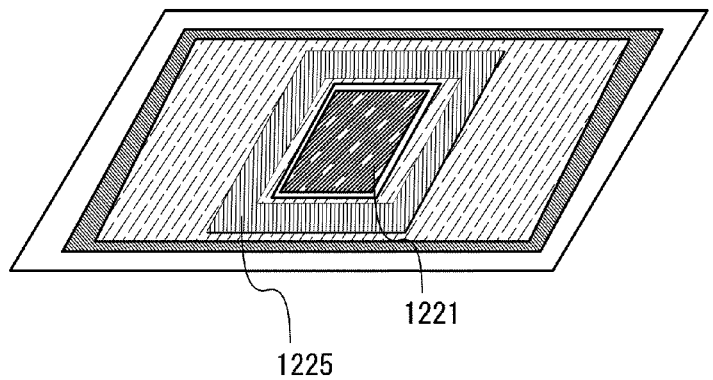

In Example 2, a groove (opening portion) into which the film used for separation is inserted was defined as the drawing line 322; however, one embodiment of the present invention is not limited to this method. In this example, a method for forming a groove, which is different from the method in Example 2, is described with reference to FIGS. 12A and 12B.

An ultraviolet laser beam 1220 (having a wavelength of 266 nm and an output of 1.3 W to 1.8 W) was used to form a drawing line 1222 so as to surround a region 1221 which functions as a panel and expose a separation layer. Moreover, a drawing line 1223 was formed so as to surround the drawing line 1222 and expose the separation layer. That is, two drawing lines were formed on the outer side of the region 1221 which functions as a panel. Further, a region 1224 which is removed later was formed between the drawing line 1222 and the drawing line 1223. The distance between the drawing line 1222 and the drawing line 1223 is preferably about 0.5 mm to 2 mm. In addition, the width of each of the drawing line 1222 and the drawing line 1223 is preferably about 0.05 mm to 0.1 mm. In this example, the distance between the drawing line 1222 and the drawing line 1223 was 0.8 mm and the width of each of the drawing line 1222 and the drawing line 1223 was 0.1 mm.

Next, the region 1224 was removed by a cutter or the like. As a result, a groove 1225 in which the separation layer is exposed was formed. In addition, the width of the groove 1225 is preferably about 1 mm to 2 mm. In this example, the width of the groove 1225 was 1 mm.

Then, an etchant was introduced into the groove 1225. As a result, the separation layer which is in contact with the etchant was dissolved and partly lifted off. Next, a film was inserted into a portion where lift-off progresses while the etchant was added. That is, the film was inserted into the dissolved separation layer. The film may be formed using an organic resin such as film-shaped polyethylene terephthalate (PET), polyethylene naphthalate (PEN), or polyether sulfone (PES). In this example, a PEN film (having a thickness of 50 μm) was used as the film.

In this example, the groove 1225 was formed by forming two drawing lines by using the ultraviolet laser beam 1220 so that a space large enough that the film is inserted into the separation layer can be secured. Further, because the separation layer is exposed in the groove 1225, additional steps are not necessary. The separation layer can be in contact with the etchant by only introducing the etchant into the groove 1225.

Note that the structure described in this example can be combined with the structure described in any of other embodiments or examples in this specification as appropriate.

Example 4

In accordance with Example 2, a flexible passive matrix light-emitting element was manufactured.

Figure 10A:
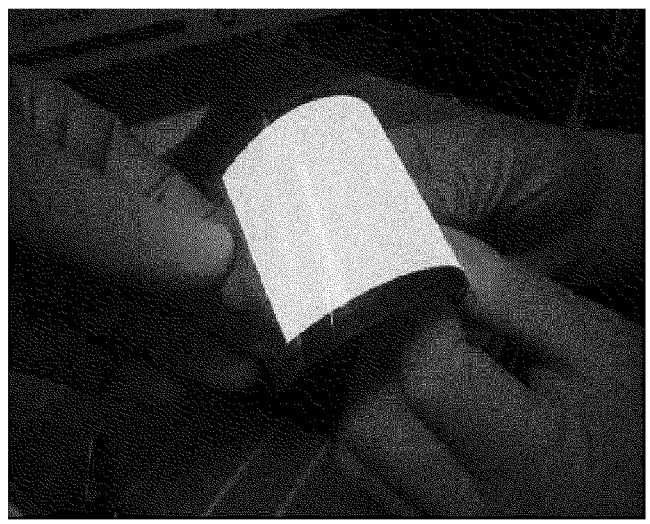
FIGS. 10A and 10B are drawings showing Example 4.
Figure 10B:
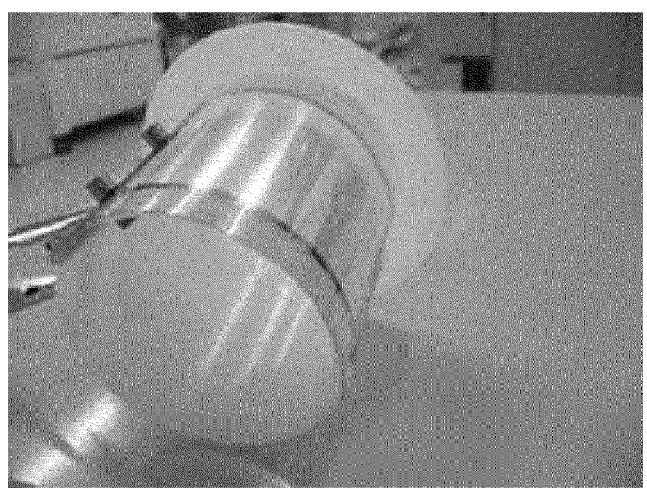

FIG. 10A is a photograph showing that a first end portion and a second end portion of a flexible light-emitting element are held in hands and moved closer to one another such that the distance between the first end portion and the second end portion is about 3 cm to 5 cm and a flexible light-emitting element emits light while being curved. FIG. 10B is a photograph showing that a flexible light-emitting element emits light while being attached to a cylindrical plastic base material with a diameter of 73 mm.

Example 5

Figure 11A:
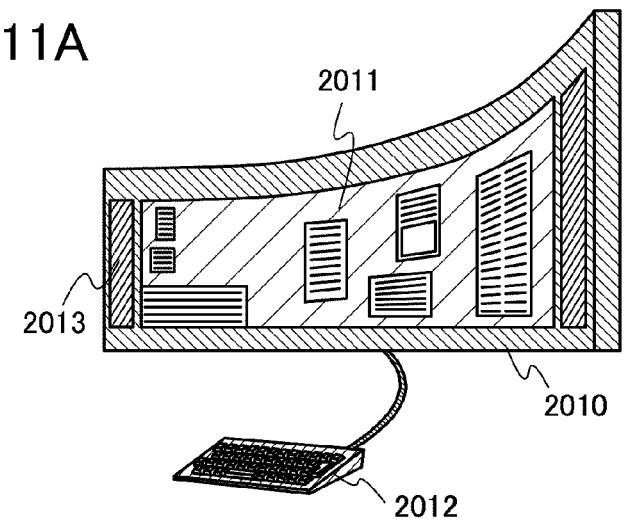
FIGS. 11A and 11B are drawings illustrating Example 5.
Figure 11B:
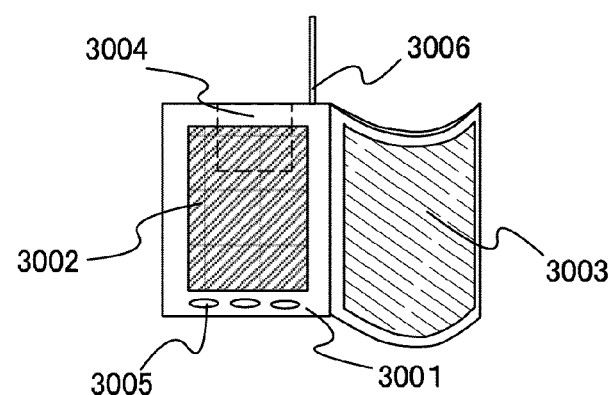

In this example, electronic devices including the flexible light-emitting device which is obtained in Embodiments 1 to 4 and Examples 1 to 3 in a display portions are described. As examples of the electronic devices which can include the flexible light-emitting device according to one embodiment of the present invention, video cameras, digital cameras, head-mounted displays (goggle-type displays), car navigation systems, projectors, car stereos, personal computers, portable information terminals, e-book readers, and the like can be given. FIGS. 11A and 11B illustrate examples of such electronic devices.

FIG. 11A illustrates a television device including a housing 2010, a keyboard portion 2012 which is an operation portion, a display portion 2011, a speaker portion 2013, and the like. One embodiment of the present invention is applied to the manufacture of the display portion 2011. A flexible light-emitting device which can be curved is used in the display portion in FIG. 11A; thus, the television device has the curved display portion. In such a manner, the shape of the display portion can be freely designed; therefore, a television device having a desired shape can be manufactured.

Note that one embodiment of the present invention is not limited to the television device and is also applicable to various usages such as a monitor of a personal computer and a display medium, for example, an information display board at a train station, an airport, or the like, or an advertisement display board on the street.

FIG. 11B illustrates a portable information terminal (e-book reader) including a main body 3001, display portions 3002 and 3003, a storage medium 3004, operating switches 3005, an antenna 3006, and the like.

This application is based on Japanese Patent Application serial no. 2008-296369 filed with Japan Patent Office on Nov. 20, 2008, the entire contents of which are hereby incorporated by reference.

What is claimed is:

1. A method for manufacturing a flexible semiconductor device, comprising the steps of:
    forming a separation layer over a substrate;
    forming a semiconductor element over the separation layer;
    forming a resin layer over the semiconductor element;
    dissolving the separation layer by using an etchant;
    inserting a film into a region where the separation layer is dissolved; and
    separating the semiconductor element from the substrate by moving the film in a direction toward a region where the separation layer is not dissolved.

2. The method for manufacturing a flexible semiconductor device according to claim 1, wherein the film comprises polyethylene naphthalate.

3. The method for manufacturing a flexible semiconductor device according to claim 1, wherein the etchant is an alkali solution.

4. The method for manufacturing a flexible semiconductor device according to claim 1, wherein the etchant is a mixture solution containing ammonia and hydrogen peroxide.

5. The method for manufacturing a flexible semiconductor device according to claim 1, wherein the resin layer comprises an ultraviolet curable resin.

6. The method for manufacturing a flexible semiconductor device according to claim 1, wherein the separation layer comprises a metal material.

7. The method for manufacturing a flexible semiconductor device according to claim 1, wherein the separation layer comprises tungsten.

8. The method for manufacturing a flexible semiconductor device according to claim 1, further comprising the step of forming a buffer layer over the separation layer, wherein the semiconductor element is formed over the buffer layer.

9. The method for manufacturing a flexible semiconductor device according to claim 8, wherein the buffer layer comprises an insulating material.

10. A method for manufacturing a flexible semiconductor device, comprising the steps of:
    forming a separation layer over a substrate;
    forming a semiconductor element over the separation layer;
    forming a resin layer over the semiconductor element;
    forming a groove in the resin layer by performing laser irradiation so as to surround the semiconductor element;
    dissolving the separation layer along the groove by using an etchant;
    inserting a film into a region where the separation layer is dissolved; and
    separating the semiconductor element from the substrate by moving the film in a direction toward a region where the separation layer is not dissolved.

11. The method for manufacturing a flexible semiconductor device according to claim 10, wherein the film comprises polyethylene naphthalate.

12. The method for manufacturing a flexible semiconductor device according to claim 10, wherein the etchant is an alkali solution.

13. The method for manufacturing a flexible semiconductor device according to claim 10, wherein the etchant is a mixture solution containing ammonia and hydrogen peroxide.

14. The method for manufacturing a flexible semiconductor device according to claim 10, wherein the resin layer comprises an ultraviolet curable resin.

15. The method for manufacturing a flexible semiconductor device according to claim 10, wherein the separation layer comprises a metal material.

16. The method for manufacturing a flexible semiconductor device according to claim 10, wherein the separation layer comprises tungsten.

17. The method for manufacturing a flexible semiconductor device according to claim 10, further comprising the step of forming a buffer layer over the separation layer, wherein the semiconductor element is formed over the buffer layer.

18. The method for manufacturing a flexible semiconductor device according to claim 17, wherein the buffer layer comprises an insulating material.

* * * * *